United States Patent
Zhang et al.

(10) Patent No.: US 12,093,562 B2
(45) Date of Patent: Sep. 17, 2024

(54) CONTROLLER WITH SMART SCHEDULING AND METHOD OF OPERATING THE CONTROLLER

(71) Applicant: SK hynix Inc., Gyeonggi-do (KR)

(72) Inventors: Fan Zhang, Fremont, CA (US); Norton Chu, Los Altos, CA (US); Xuanxuan Lu, San Jose, CA (US); Chenrong Xiong, San Jose, CA (US)

(73) Assignee: SK hynix Inc., Gyeonggi-do (KR)

(*) Notice: Subject to any disclaimer, the term of this patent is extended or adjusted under 35 U.S.C. 154(b) by 242 days.

(21) Appl. No.: 16/747,345

(22) Filed: Jan. 20, 2020

(65) Prior Publication Data

US 2021/0223987 A1   Jul. 22, 2021

(51) Int. Cl.
G06F 3/06 (2006.01)
G06N 7/01 (2023.01)
H03M 13/00 (2006.01)
H03M 13/15 (2006.01)

(52) U.S. Cl.
CPC .......... *G06F 3/0659* (2013.01); *G06F 3/0611* (2013.01); *G06F 3/0679* (2013.01); *G06N 7/01* (2023.01); *H03M 13/1575* (2013.01); *H03M 13/616* (2013.01)

(58) Field of Classification Search
CPC .... G06F 3/0659; G06F 3/0611; G06F 3/0679; G06N 7/005; G06N 7/01; H03M 13/1575; H03M 13/616
See application file for complete search history.

(56) References Cited

U.S. PATENT DOCUMENTS

| | | | |
|---|---|---|---|
| 8,255,618 B1* | 8/2012 | Borchers | G06F 13/1642 710/24 |
| 9,037,783 B2 | 5/2015 | Koh et al. | |
| 2008/0024899 A1* | 1/2008 | Chu | G06F 3/0646 711/E12.019 |
| 2014/0355340 A1* | 12/2014 | Sharon | G11C 29/04 365/185.03 |
| 2015/0085571 A1* | 3/2015 | Hu | G11C 11/5642 365/185.21 |
| 2015/0085573 A1* | 3/2015 | Sharon | G06F 11/004 365/185.03 |
| 2017/0123898 A1* | 5/2017 | Ryabinin | G06F 3/0679 |
| 2017/0148510 A1* | 5/2017 | Bazarsky | G11C 11/5642 |
| 2018/0032396 A1* | 2/2018 | Sharon | H03M 13/3738 |
| 2019/0042102 A1* | 2/2019 | Kim | G06F 3/0659 |
| 2019/0155546 A1* | 5/2019 | Cai | G06F 3/0659 |
| 2021/0182077 A1* | 6/2021 | Chen | G06T 7/20 |

OTHER PUBLICATIONS

An article attached available online at https://www.geeksforgeeks.org/shortest-job-first-cpu-scheduling-with-predicted-burst-time/ that describes the benefits of shortest-latency-first scheduling (Year: 2019).*

* cited by examiner

Primary Examiner — Michael Krofcheck
Assistant Examiner — Janice M. Girouard
(74) Attorney, Agent, or Firm — IP & T GROUP LLP (57) ABSTRACT

Memory controllers and decoders of memory systems and methods for operating the same, which employ smart scheduling of commands to be processed to reduce overall execution time. A metric function is applied to determine or update the priority of each of the multiple commands in multiple queues based on expected execution time and expected wait time such that the smart scheduling scheme provides significant improvement in terms of quality-of-service (QoS) of the memory system.

15 Claims, 9 Drawing Sheets

CONTROLLER WITH SMART SCHEDULING AND METHOD OF OPERATING THE CONTROLLER

BACKGROUND

1. Field

Embodiments of the present disclosure relate to a smart scheduling scheme to reduce execution and wait times for commands or other data to be processed by a decoder of controller of memory system, and a method of operating the scheduling scheme.

2. Description of the Related Art

The computer environment paradigm has shifted to ubiquitous computing systems that can be used virtually anytime and anywhere. As a result, the use of portable electronic devices, such as mobile phones, digital cameras, and notebook computers has rapidly increased. These portable electronic devices generally use a memory system having memory device(s), that is, data storage device(s). A data storage device is used as a main memory device or an auxiliary memory device of the portable electronic devices.

Data storage devices used as memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

An SSD may include flash memory components and a controller, which includes the electronics that bridge the flash memory components to the SSD input/output (I/O) interfaces. An SSD controller may include an embedded processor that executes functional components such as firmware. SSD functional components are typically device specific, and in most cases, can be updated.

The two main types of flash memories are named after the respective NAND and NOR logic gates that configure them. The individual flash memory cells exhibit internal characteristics similar to those of their corresponding gates. NAND-type flash memory may be written to and read from in blocks (or pages) which are generally much smaller than the entire memory space. NOR-type flash memory allows a single machine word (byte) to be written to an erased location or read independently. NAND-type flash memory operates primarily in memory cards, USB flash drives, solid-state drives (SSDs), and similar products, for general storage and transfer of data.

In an SSD, data is typically stored in multiple NAND flash memory chips that are operably coupled to multiple NAND channels. Usually, there is at least one decoder, and often a set of decoders, serving multiple NAND channels. For example, there may be one bit-flipping (BF) decoder and one min-sum (MS) decoder serving four NAND channels. To serve multiple channels, there are typically several command queues that hold the commands waiting for the same decoder. In a high queue-depth situation, there may be hundreds of commands in the system. A lengthy wait time for commands down in the queues can cause degradation of performance and quality-of-service (QoS).

In this context embodiments of the present invention arise.

SUMMARY

Embodiments of the present invention provide a smart scheduling scheme for a decoder to reduce overall execution time for commands and other data waiting for processing by the decoder, which reduction can improve performance and QoS of the memory system in which the decoder resides.

An aspect of the present invention is directed to systems with smart scheduling. One such system comprises queues for holding respective subsets of commands with different priorities; a scheduler configured to schedule the commands for processing based on respective priorities and expected completion times of the commands; and a decoder operably coupled to the queues for receiving and decoding the commands according to their respective schedules, as determined by the scheduler.

In another aspect, the present invention is directed to methods for scheduling the sending commands to a decoder. One such method comprises queueing respective subsets of commands in respective queues; scheduling the commands for processing by the decoder, using a scheduler, based on respective priorities and expected completion times of the commands; and transmitting the commands from the queues to the decoder for processing according to their respective schedules, as determined in the scheduling operation.

Another aspect of the present invention is directed to memory controllers. One such controller comprises queues for holding respective subsets of a plurality of commands with different priorities; a scheduler to determine or update a priority of each of the commands using a metric function, and to schedule the commands based on the determined or updated priorities of the commands; and an error-correction code (ECC) decoder operably coupled to the queues for receiving and processing the commands according to their respective schedules, as determined by the scheduler.

Additional aspects of the present invention will become apparent from the following description.

BRIEF DESCRIPTION OF THE DRAWINGS

FIGS. 7A and 7B are graphical representations of latency vs. command index (sorted), in which FIG. 7A shows a uniform distribution of per command latency and FIG. 7B shows a Gaussian distribution of per command latency, in accordance with embodiments of the present invention.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
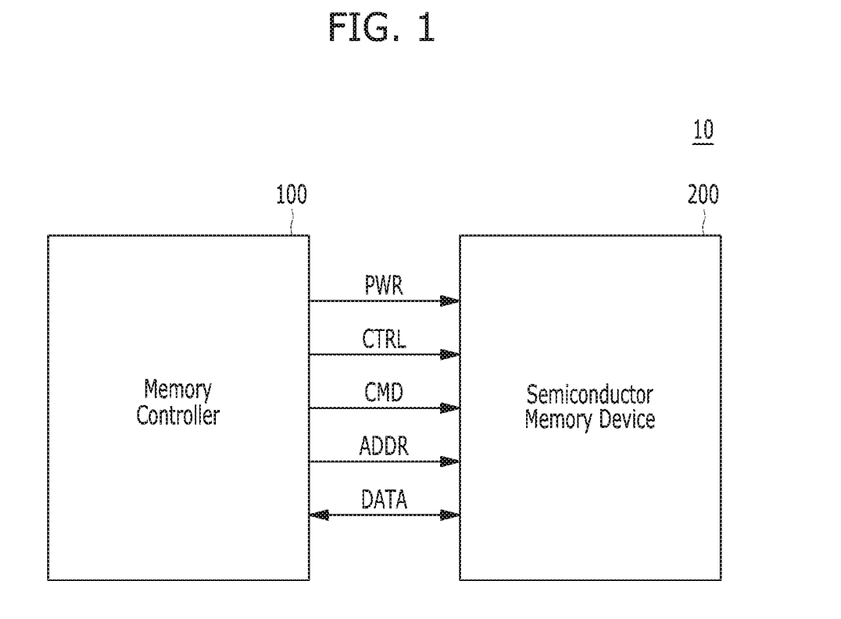
FIG. 1 is a block diagram illustrating a memory system in accordance with an embodiment of the present invention.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. For brevity, memory controller 100 and semiconductor memory device 200 are sometimes simply referred to below as controller 100 and memory device 200, respectively.

The controller 100 may control overall operations of the memory device 200.

The memory device 200 may perform one or more erase, program, and read operations under the control of the memory controller 100. The memory device 200 may receive a command CMD, an address ADDR and data DATA through input/output (I/O) lines. The memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the memory system 10 is used in an SSD, operation speed of a host (not shown) coupled to the memory system may remarkably improve.

In another embodiment, the memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

In still another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
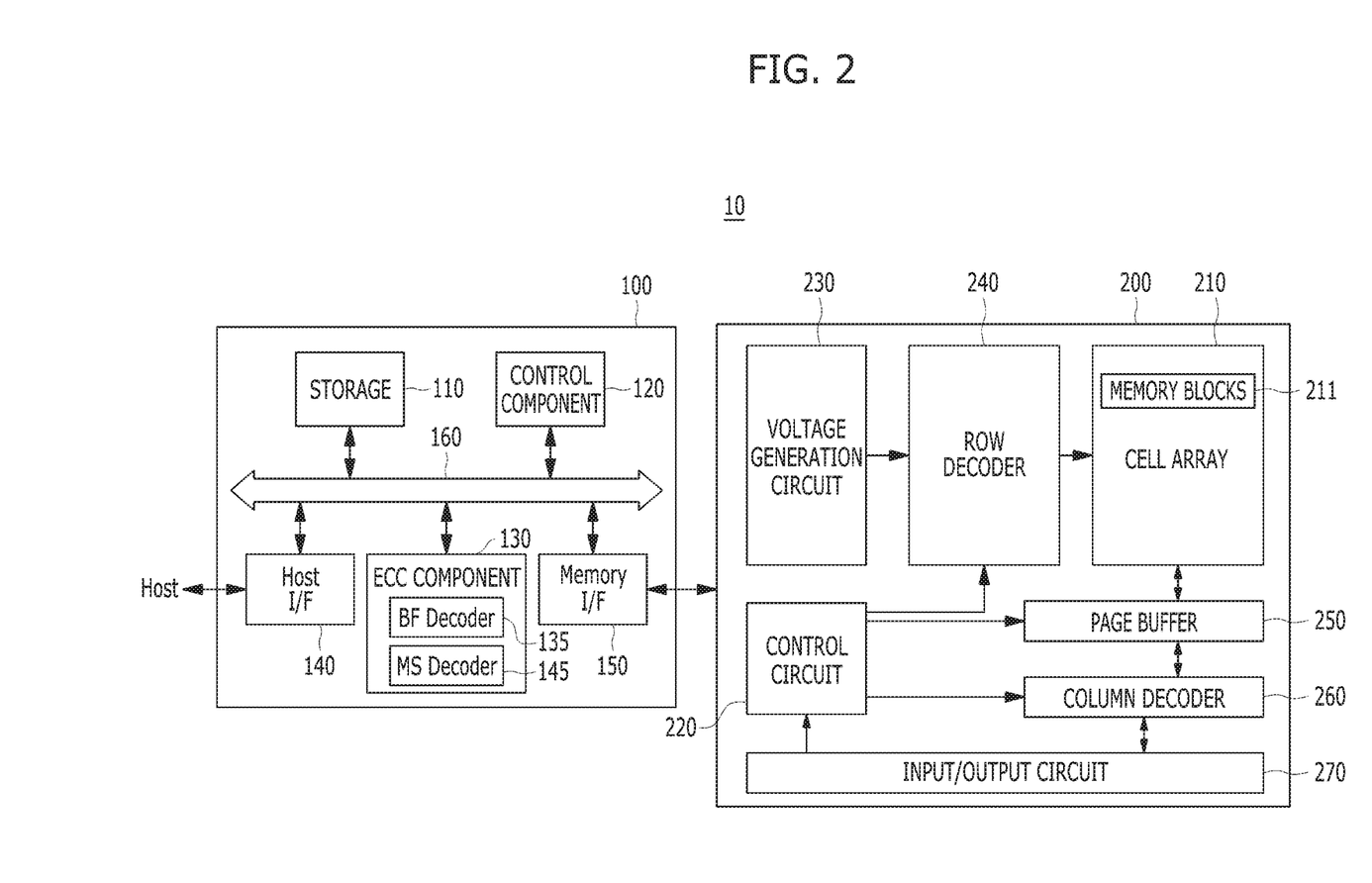
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented as any one of various types of electronic devices. In some embodiments, the host device may include an electronic device, such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device, such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure to correct the error bits.

The ECC component 130 may perform an error correction operation based on a coded modulation, such as a low-density parity-check (LDPC) code including both regular and irregular LDPC codes, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM).

The ECC component 130 may also decode commands, e.g., those received from a host via the host interface 140. To that end, in embodiments of the present invention, the FCC component 130 includes at least one decoder and may include multiple decoders of different types, e.g., a bit-flipping (BF) decoder 135 and a min-sum (MS) decoder 145. As described in more detail below, the smart scheduling scheme may be used in connection with a BF decoder 135 and/or an MS decoder 145. However, the present invention is not limited to those two types of decoders; rather, the present invention may be used with any suitable type(s) of decoder(s). Thus, the ECC component 130 may include any and all circuits, systems or devices for suitable error correction operation, in accordance with embodiments of the present invention.

The host interface 140 may communicate with the host device through one or more of various interface protocols, such as a universal serial bus (USB), a multi-media card (MMC), a peripheral component interconnect express (PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
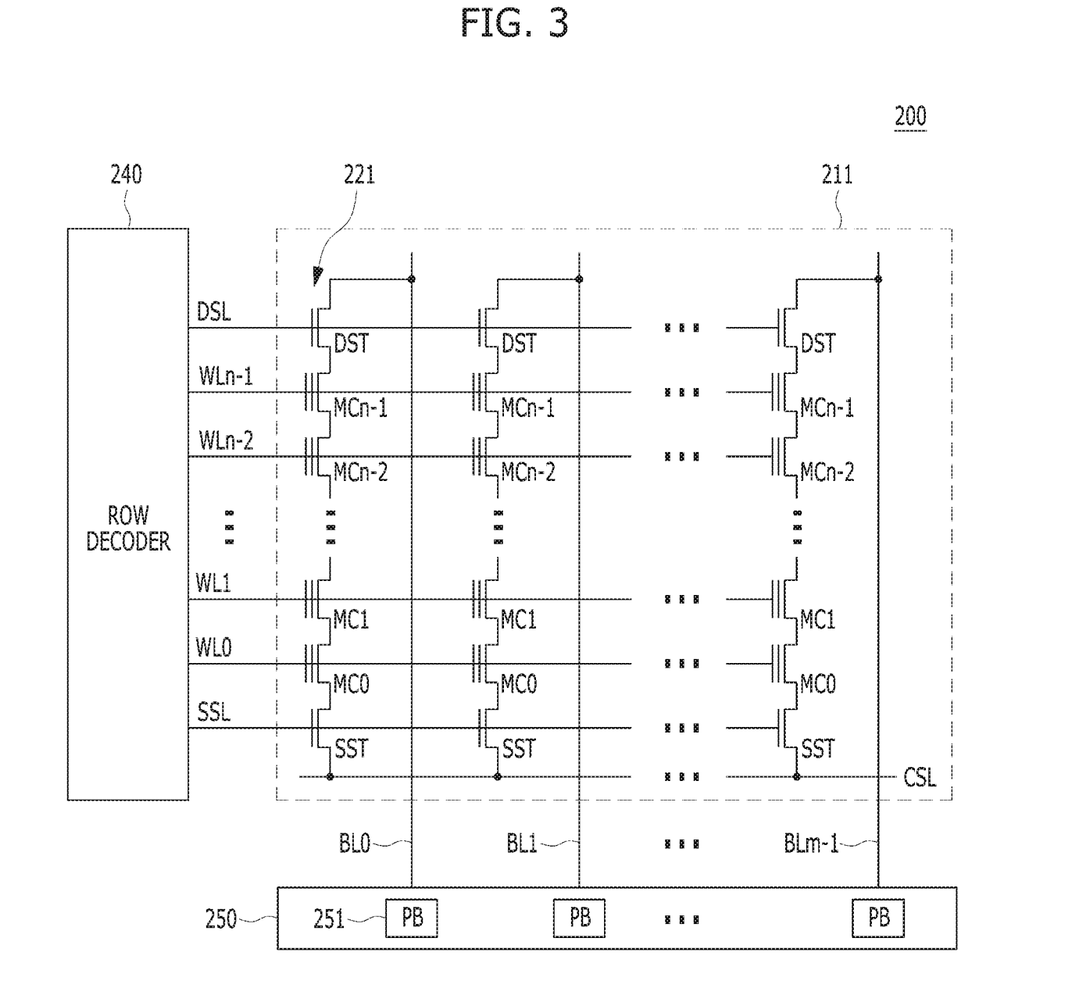
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

As previously noted, embodiments of the present invention provide techniques embodied in system, devices and methods that employ smart scheduling in the queuing and processing of commands. Such commands may be queued for processing by one or more decoders.

Figure 4:
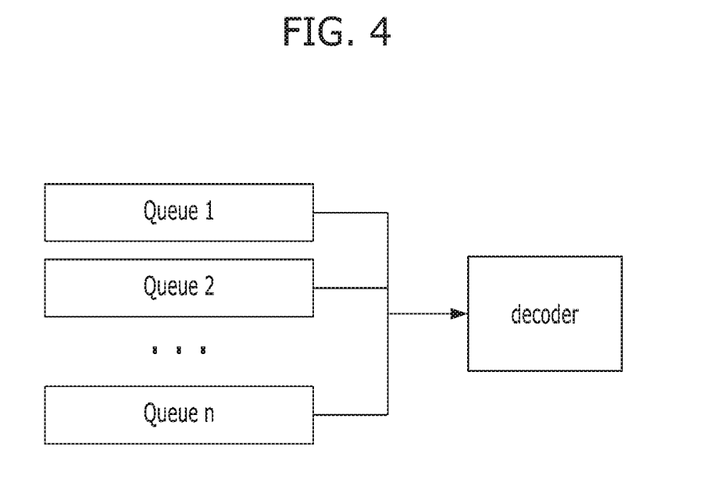
FIG. 4 is a schematic diagram illustrating a decoder and associated command queues.

FIG. 4 shows a conventional command queue structure for a decoder. There are multiple, i.e., n, command queues, each of which is operably coupled to a decoder. The queues hold commands of different types that have different priorities. Each queue operates according to a first-in-first-out (FIFO) scheme.

Embodiments of the present invention improve this basic queuing arrangement. For example, in the case of a single queue, rather than the queue sending its commands to the decoder in the order in which the commands are queued, various predictions or estimations are made to change the queued order of the commands to reduce the overall processing time, i.e., the time to process all of the commands in the queue. Execution time for each of the commands may be predicted and the queued order of the commands changed. That is, the command with the shortest predicted execution time is placed first in the queue, while the command with the longest predicted execution time is placed last in the queue. Doing so, improves quality-of-service (QoS) and performance of the decoder, as well as the system in which the decoder resides.

Figure 5:
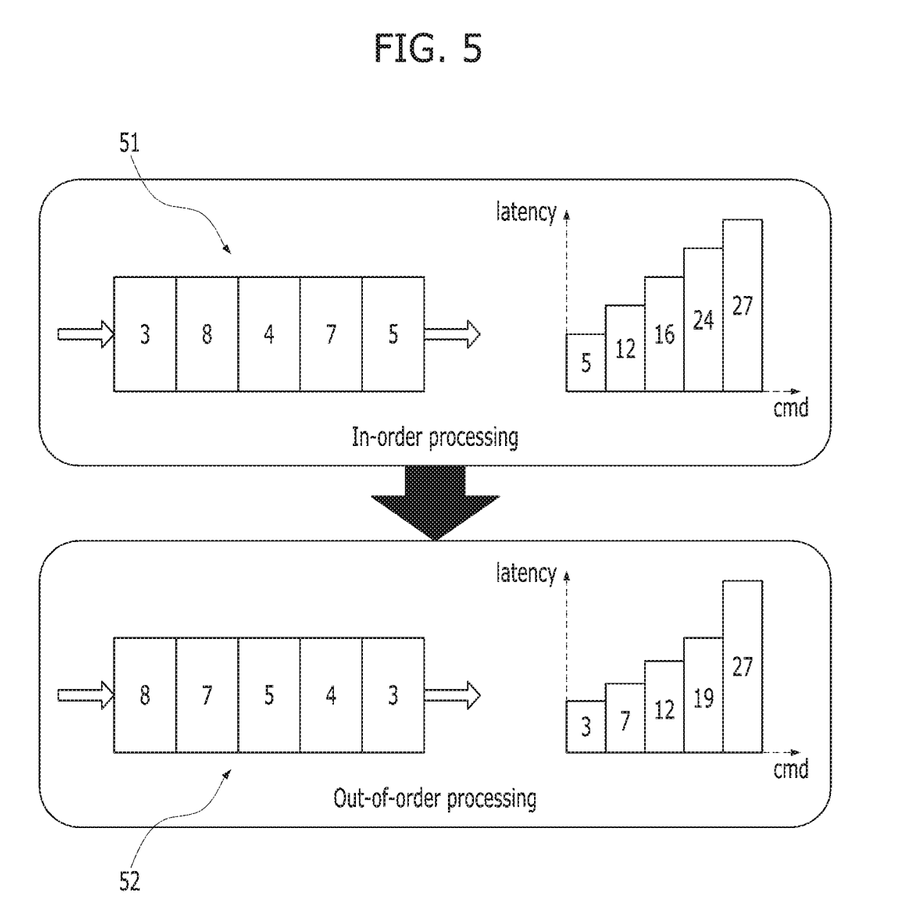
FIG. 5 is a schematic diagram illustrating command queuing and processing in accordance with an embodiment of the present invention.

FIG. 5 illustrates an example of a single command queue according to an embodiment of the present invention. In this example, five (5) commands are shown in queue 51. Initially, these commands are queued to be sent the decoder in the order in which the commands were received.

According to an embodiment of the present invention, the execution time for each of the five (5) commands is predicted. As can be seen, in queue 51, the first queued command has a predicted execution time of 5. The first queued command is followed by commands with predicted execution times of 7, 4, 8 and 3, respectively. The unit of execution time may be any suitable time measurement unit.

Having predicted the execution times of the commands in queue 51, such information may be used to schedule execution of the commands by the decoder. Scheduling may entail reordering the commands to place the commands in ascending order of execution time. That is, the command with the shortest predicted execution time, i.e., 3, is placed first in the queue and the command with the longest predicted execution time, i.e., 8, is placed last in the queue. The order of each of the other commands is also changed, as needed, on that basis. The commands in their new order are shown in queue 52 of FIG. 5.

The cumulative latency of the commands as the commands are processed by the decoder is shown for each of the queues 51, 52 in FIG. 5. While the total latency remains the same, the cumulative latency for the first four (4) commands is less for queue 52 than for queue 51.

Figure 6:
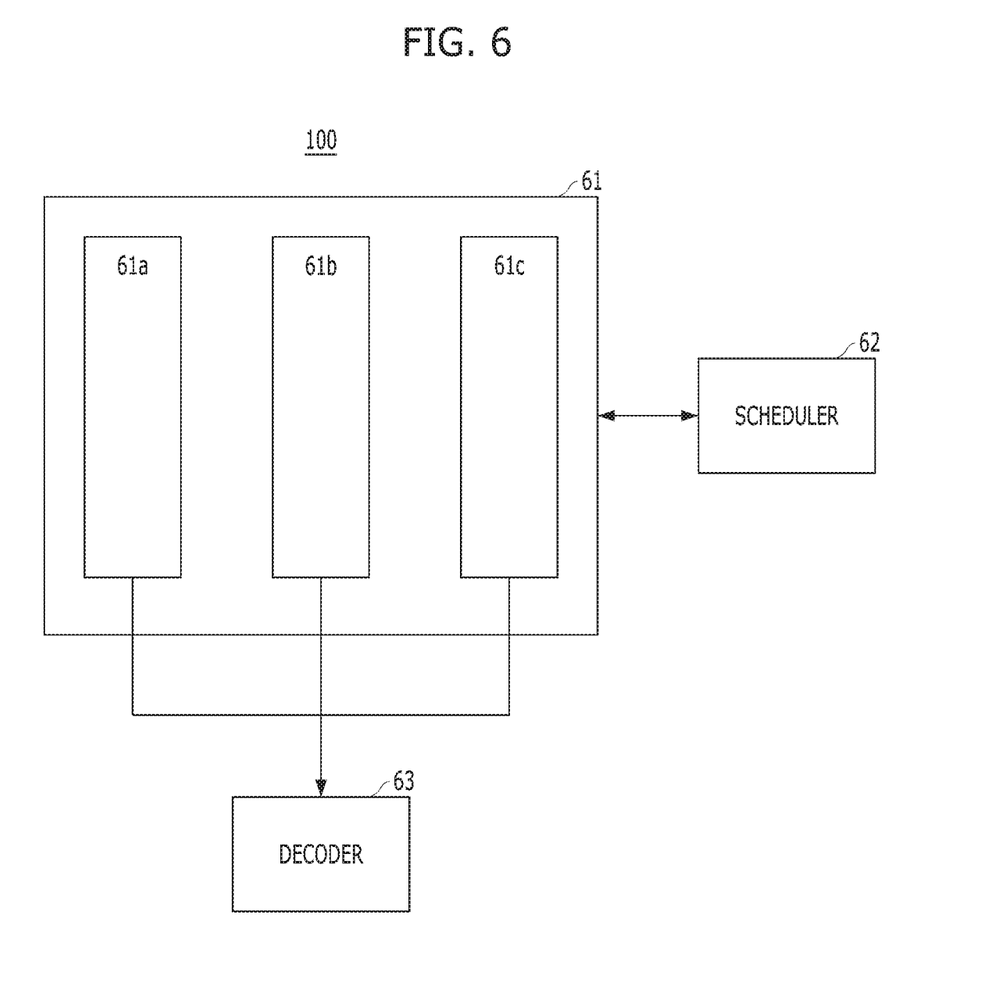
FIG. 6 is a schematic diagram illustrating a multiple command queue configuration in accordance with an embodiment of the present invention.

In an arrangement of multiple queues, the scheduling of commands may be more complicated when each queue holds commands having a different priority level. FIG. 6 illustrates a multiple command queue configuration.

Referring to FIG. 6, multiple command queue 61 includes, by way of example, three (3) command queues: 61a, 61b and 61c. Additional command queues may be included as those skilled in the art will understand. In general, the multiple command queue 61 includes two (2) or more command queues. Each queue may hold a subset of the commands received. Each of the commands of a particular subset may have the same priority, such that commands in different queues may have different priorities.

The multiple command queue 61 may be operably coupled to a smart scheduler 62, which schedules the commands to be sent to a decoder 63, which is also operably coupled to the multiple command queue 61.

In accordance with an embodiment of the present invention, the scheduler 62 considers the priorities of the commands in the queues 61a, 61b, 61c, along with command execution times, in scheduling the commands. The scheduler 62 may also take into account the non-static nature of command priorities. Predicted wait times of the commands may also be considered by the scheduler 62.

To that end, the scheduler 62 may use a metric to dynamically update the priority of each of the commands in all queues, e.g., queues 61a, 61b, 61c. In an embodiment, the scheduler 62 may determine the updated priority of a command, i.e., priority(t+1), based on a function of the command's current priority, i.e., priority(t), its predicted execution time, and its predicted wait time.

Thus, priority(t+1)=ƒ(priority(t+1), predicted execution time, predicted wait time).

At each update cycle, the command with highest updated priority is sent to the decoder 63. The function, ƒ( ), may be selected to maximize throughput, minimize worst case latency, improve QoS, or to achieve any of various other suitable goals.

For an ECC decoder, e.g., either or both of the BF decoder 135 and MS decoder 145 of the ECC component 130, execution latency can be estimated based on syndrome weight. Execution latency may be estimated by the ECC component 130 and/or the control component 120, or any other suitable component(s).

In an embodiment, such latency is estimated as follows: Latency=ax+b, if x<X; otherwise, Latency=T. Here, x is the syndrome weight and may be based on noise of the codeword, c', and the parity check matrix H of the error-correcting code being utilized by the decoder. That is, x=c'*H. X represents the upper bound of the syndrome weight at which the decoder latency saturates to its maximum value, T. Here, a and b may be predefined parameters which depend on the code being used.

The multiple command queues 61 and the smart scheduler 62 may be components of the controller 100. Each may be a separate component or integrated with another suitable component in the controller 100. For example, the multiple command queues 61 and the smart scheduler 62 may be embodied in the FCC component 130. In another embodiment, the smart scheduler 62 may be part of the control component 120, the processor of which may make, or assist in making, the determinations/calculations for the smart scheduler 62. Alternatively, the smart scheduler 62 may include processing circuitry to perform the determinations/calculations described above as a separate component or part of another component, e.g., the ECC component 130.

Figure 7A:
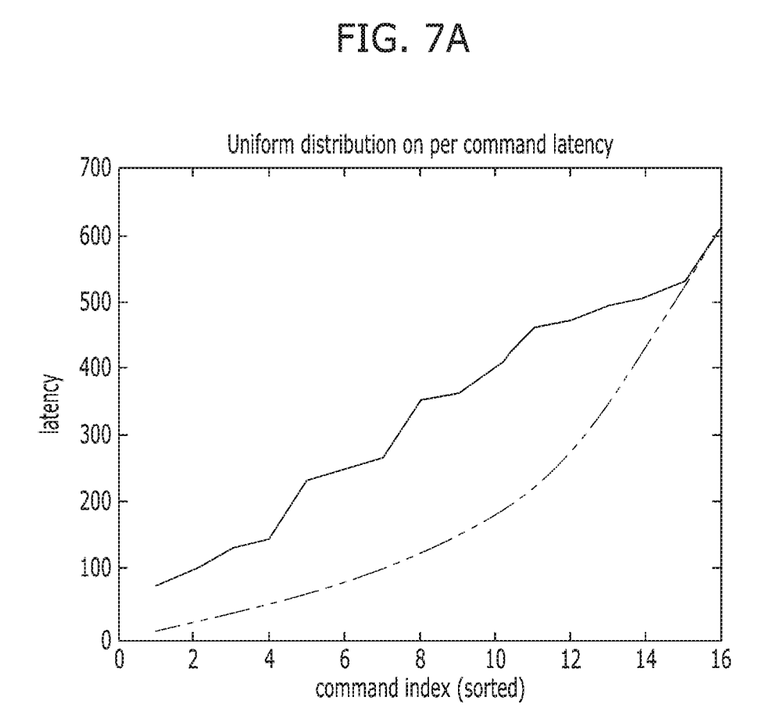
Figure 7B:
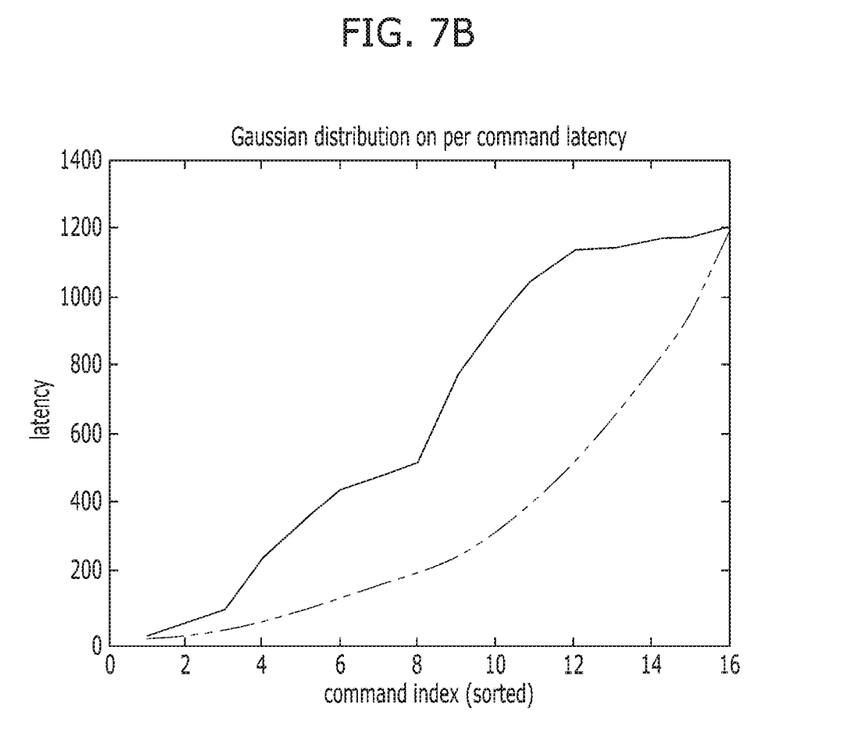

The smart scheduler 62, according to embodiments of the present invention, can provide approximately 30% higher throughput and better QoS with respect to conventional processing. FIGS. 7A and 7B show latency vs. command index (sorted) for a single queue with 16 commands. FIG. 7A shows a uniform distribution of per command latency, and FIG. 7B shows a Gaussian distribution of per command latency.

Figure 8:
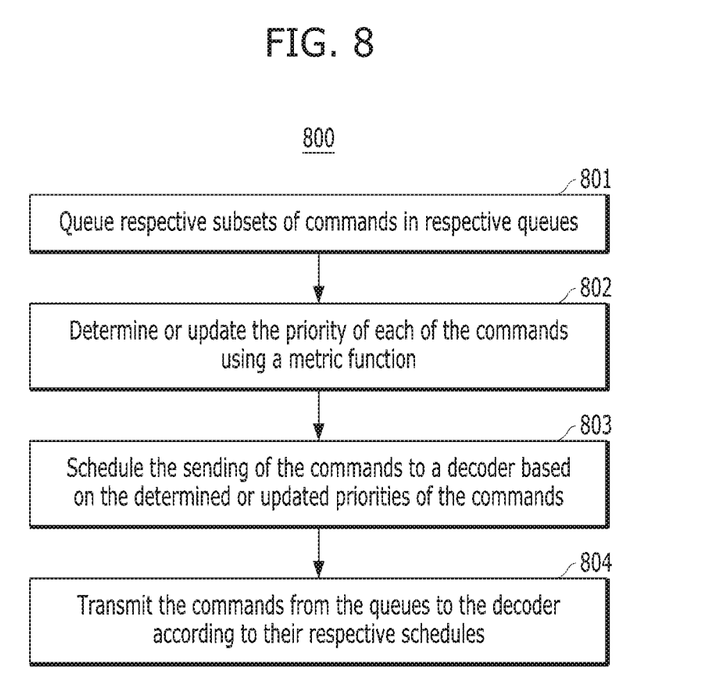
FIG. 8 is a flow chart illustrating steps in processes for scheduling commands to be sent to a decoder, in accordance with embodiments of the present invention.

Exemplary processing flow incorporating the smart scheduling scheme is shown in flow chart 800 of FIG. 8. The steps shown in flow chart 800 are exemplary. Those skilled in the art will understand that additional and/or alternative steps may be performed, or that the order of steps may be changed, to effectuate aspects of the present invention without departing from the inventive concepts disclosed herein. The steps may be performed by any suitable component or combination of components consistent with the description and teachings herein. With that in mind, FIG. 8 is described with reference to other figures, particularly FIGS. 2, 5 and 6.

Referring to FIG. 8, at step 801 respective subsets of commands are queued in respective queues of a multi-queue assembly, e.g., multiple queues 61. Each command has a priority associated with it. In an embodiment, all commands in the same queue have the same priority, with the different queues holding commands of different priorities.

At step 802, a metric function is applied to determine or update the priority of each of the commands. The metric function may be selected and configured as previously described.

At step 803, the smart scheduler 62 schedules the sending of the commands to the decoder 63 based on the determined or updated priorities of the commands.

At step 804, the commands are transmitted from their queues to the decoder 63 according to their respective schedules.

As the foregoing demonstrates, embodiments of the present invention provide improved decoding by employing a smart scheduling scheme. The decoding scheme improves performance of memory systems in terms of throughput and QoS, especially in mobile and client SSD applications. Decoding performance is improved while still meeting power consumption requirements.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory system comprising:
   a memory controller in communication with a host;
   a memory device in communication with the memory controller;
   a plurality of queues in the memory controller for holding respective subsets of a plurality of commands with different priorities;
   a scheduler in the memory controller configured to schedule the plurality of commands for processing based on respective priorities and expected completion times of the commands for each of the plurality of commands with the different priorities in the queues; and
   an error correction decoder in the memory controller operably coupled to the plurality of queues in the memory controller for receiving and decoding the commands according to respective schedules of the commands in the queues waiting for the error correction decoder, as determined by the scheduler,
   wherein
   in a first queue of the plurality of queues in the memory controller, a first set of commands of the plurality of commands are processed according to que-specific priorities of the first queue and que-specific expected completion times for the memory device to complete the first set of commands including execution latency of the error correction decoder,
   the que-specific completion times of the commands in the first queue are based on predicted execution times for the memory device to execute the first set of commands,
   predicted wait times for the first set of commands to wait in the first queue are considered by the scheduler,
   between queuing the first set of commands in the first queue and sending the first set of commands to the error correction decoder, the scheduler determines an updated priority of a command in the first queue based a current priority, a predicted execution time, and a predicted wait time of the command, and
   at each update cycle, the command with highest updated priority is sent to the error correction decoder, wherein the memory system determines the expected completion times by estimating the execution latency of the error correction decoder, and wherein the memory system estimates the execution latency of the error correction decoder based on syndrome weight.

2. The memory system of claim 1, wherein the expected completion time for each of the plurality of commands includes an expected execution time.

3. The memory system of claim 2, wherein the expected completion time for each of the plurality of commands includes an expected wait time.

4. The memory system of claim 1, wherein the syndrome weight is based on a parity check matrix of an error correcting code used by the error correction decoder.

5. The memory system of claim 1, wherein at each update cycle, a shortest predicted execution time command is placed first in the first queue for the error correction decoder, while a longest predicted execution time command is placed last in the first queue for the error correction decoder.

6. The memory system of claim 1, wherein the scheduler is configured to schedule the plurality of the commands for processing based on the respective priorities of each of the commands in all of the queues.

7. A method for scheduling and sending commands to an error correction decoder for a memory device, the method comprising:

queueing respective subsets of commands in respective queues;

scheduling the commands for processing by the error correction decoder, using a scheduler, based on respective priorities and expected completion times of the commands for each of the plurality of commands with the different priorities in the queues including execution latency of the error correction decoder;

transmitting the commands from the queues in a memory controller to the error correction decoder for processing according to respective schedules of the commands in the queues waiting for the error correction decoder, as determined in the scheduling operation, wherein in a first queue of the respective queues in the memory controller, a first set of commands of the subsets of commands are processed according to que-specific priorities of the first queue and que-specific expected completion times for the memory device to complete the first set of commands, the que-specific completion times of the commands in the first queue are based on predicted execution times for the memory device to execute the first set of commands, predicted wait times for the first set of commands to wait in the first queue are considered by the scheduler, between queuing the first set of commands in the first queue and sending the first set of commands to the error correction decoder, the scheduler determines an updated priority of a command in the first queue based a current priority, a predicted execution time, and a predicted wait time of the command, and at each update cycle, the command with highest updated priority is sent to the error correction decoder; and determining the expected completion times of the commands by estimating the execution latency of the error correction decoder, wherein the scheduling of the commands for processing by the error correction decoder comprises estimating the execution latency of the error correction decoder based on syndrome weight.

8. The method of claim 7, wherein the expected completion time for each of the plurality of commands includes an expected execution time.

9. The method of claim 8, wherein the expected completion time of each for the plurality of commands includes an expected wait time.

10. The method of claim 7, wherein the syndrome weight is based on a parity check matrix of an error correcting code used by the error correction decoder.

11. The method of claim 7, wherein at each update cycle, a shortest predicted execution time command is placed first in the first queue for the error correction decoder, while a longest predicted execution time command is placed last in the first queue for the error correction decoder.

12. A memory controller comprising:

a memory controller in communication with a host;

a memory device in communication with the memory controller;

a plurality of queues in the memory controller for holding respective subsets of a plurality of commands with different priorities;

a scheduler in the memory controller to determine or update a priority for each of the commands using a metric function, and to schedule the commands based on the determined or updated priorities of the commands for each of the plurality of commands with the different priorities in the queues; and an error-correction code (ECC) decoder in the memory controller operably coupled to the plurality of queues in the memory controller for receiving and processing the commands waiting for the ECC decoder according to respective schedules for each command in the queues, as determined by the scheduler, wherein in a first queue of the plurality of queues in the memory controller, a first set of commands of the plurality of commands are processed according to que-specific priorities of the first queue and que-specific expected completion times for the memory device to complete the first set of commands including execution latency of the ECC decoder, the que-specific completion times of the commands in the first queue are based on predicted execution times for the memory device to execute the first set of commands, predicted wait times for the first set of commands to wait in the first queue are considered by the scheduler, between queuing the first set of commands in the first queue and sending the first set of commands to the ECC decoder, the scheduler determines an updated priority of a command in the first queue based a current priority, a predicted execution time, and a predicted wait time of the command, at each update cycle, the command with highest updated priority is sent to the ECC decoder, the expected completion times of the commands are determined by estimating the execution latency of the error correction decoder, and scheduling of the commands for processing by the error correction decoder comprises estimating the execution latency of the error correction decoder based on syndrome weight.

13. The memory controller of claim 12, wherein the metric function is selected in accordance with at least one of the following maximize throughput, minimize worst case latency, and improve quality-of-service of the memory controller.

14. The memory controller of claim 12, further comprising an ECC component in which the plurality of queues, the scheduler and the ECC decoder are embodied.

15. The memory controller of claim 12, further comprising a control component including a processor, the scheduler being embodied in the control component.

* * * * *